Inventors:
Bernhard R. Kuhl
Stephen H. Morrall
By: Hofgren, Wegner, Allen, Stellman & McCord
Attorneys 3,428,020

ILLUMINATED TUNING DIAL STRUCTURE

Bernhard R. Kuhl, Mount Prospect, and Stephen H. Morrall, Chicago, Ill., assignors to Warwick Electronics Inc., a corporation of Delaware Filed Sept. 4, 1964, Ser. No. 394,559
U.S. Cl. 116—124.4 7 Claims
Int. Cl. H03j 1/04

ABSTRACT OF THE DISCLOSURE

A tuning dial assembly for a multiple mode tuning frequency wave signal receiver having plural drive shafts for changing the frequency and mode of frequency received by the receiver, including a first dial on one shaft having translucent tuning frequency indicia thereon and a second dial on the other shaft having translucent mode and frequency tuning indicia thereon, with the second dial having means associated therewith for masking the first dial from a source of illumination when the frequency tuning indicia of the second dial are adjacent the source of illumination and for permitting the illumination of the first dial when the mode tuning indicia of the second dial is in a position of illumination with respect to the source of illumination.

This invention relates to television tuning devices and more particularly to a new and improved illuminated tuning dial structure for multiple frequency band television sets.

A desired objective in the production of those sets combining ultra-high frequency and very-high frequency tuning bands is to incorporate the tuning function, both fine and coarse, for both bands about a single tuning axis. Means have been provided for a accomplishing such tuning and with such means it becomes desirable to associate the tuning indicating dials with the tuning structure in such a manner so as to present the pertinent tuning information to the eye of the manipulator of the tuning structure.

It is therefore a general object of this invention to provide a new and improved dial structure for a multi-frequency television tuning apparatus.

It is a primary object of this invention to provide a new and improved illuminated dial structure for a multi-frequency tuning apparatus wherein a single source of light is utilized to selectively illuminate indicia on separate dials associated with separate frequency bands in association wth the tuning of the bands.

Another object of this invention is to provide a new and improved illuminated dial structure for a multi-frequency tuning apparatus wherein a single source of illumination is used to present translucent indicia to view on separate dials with one of the indicia bearing dials serving to selectively mask the illumination of the other dial.

Yet another object of this invention is to provide a new and improved illuminated dial structure for a multi-frequency television tuning apparatus wherein the dials are positioned in planes generally transverse to each other and a single source of illumination is utilized to selectively illuminate translucent indicia on both dials to indicate to the manipulator of the tuning apparatus which frequency is being tuned and what channel within that frequency is being tuned.

Other objects, features and advantages of the invention will be apparent from the following description taken in connection with the accompanying drawings, wherein.

Figures 1, 2, 3, 4, 5:
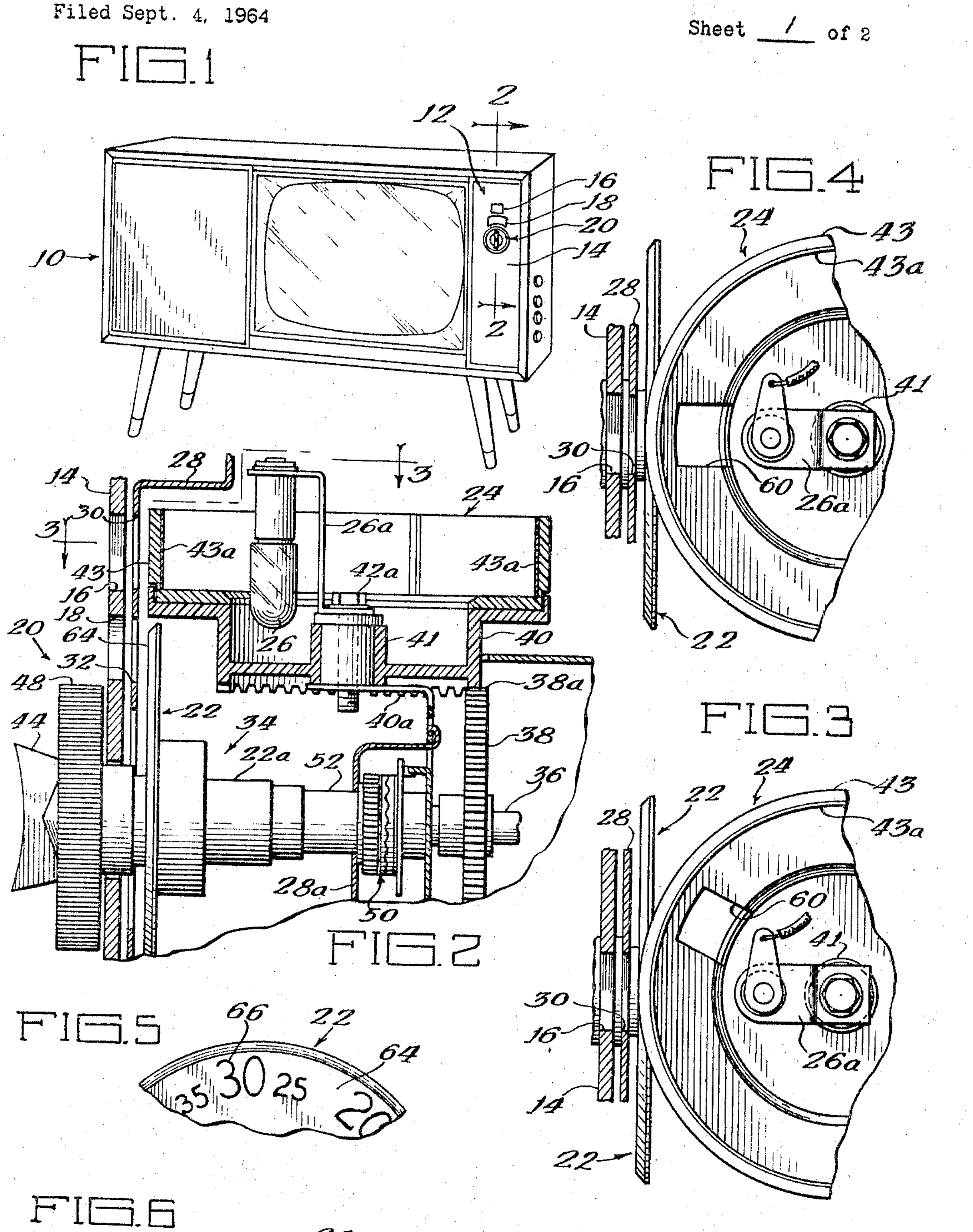
FIGURE 1 is a perspective view of a console model television set embodying the tuning structure of this invention.
FIGURE 2 is a fragmentary enlarged section view taken through the tuning portion of the television set shown in FIGURE 1.
FIGURE 3 is a section view taken along line 3—3 of FIGURE 2 showing the tuner and dial position for VHF reception.
FIGURE 4 is a section view similar to FIGURE 3, but showing the tuner and dials positioned for UHF reception.
FIGURE 5 is a fragmentary enlarged view of a portion of the UHF dial of this invention.
Figure 6:
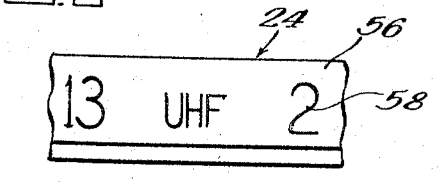
FIGURE 6 is a fragmentary enlarged view of a portion of the VHF dial of this invention.

Referring now to the drawings, in FIGURE 1 there is shown a television receiver 10 with the dial illumination structure 12 of this invention. The set is provided with a cabinet having a front wall 14 with a pair of indicia viewing windows 16 and 18 formed therein. A tuning knob assembly 20 is also positioned for illumination and selected tuning of the receiver. The tuner of this invention is provided with a UHF tuning dial 22 and a VHF tuning dial 24. A source of illumination in the form of a conventional light bulb 26 is positioned to the interior of the VHF tuning dial for illuminating the indicia on the VHF tuning dial and selectively illuminating the indicia on the UHF dial when the VHF dial is properly positioned for UHF reception by the tuner. The tuner structure is carried within a framework including a front frame member 28 and an intermediate frame member 28*a*. The front frame member is provided with openings 30 and 32 which are in alignment with the openings 16 and 18 of the front of the cabinet when the tuner is assembled therein. Preferably the light bulb is positioned so that it is in alignment with the openings in the frame and cabinet.

Means 34 is provided for connecting the knob apparatus 20 with signal receiving portion of the tuner and interconnecting the same with the indicating portion. Included in means 34 is a VHF coarse tuning shaft 36 having a conventional flat portion 36*a* at the proximal end thereof. The VHF coarse tuning shaft is connected at its distal end to a suitable stepped VHF tuner (not shown herein) for selective tuning to VHF channels as well as for activating UHF reception and deactivating VHF reception. Secured to the VHF coarse tuning shaft towards the interior of the tuner is a tuning gear 38 having teeth 38*a* thereon which are in mesh with teeth 40*a* of the opaque VHF dial carriage 40. Carriage 40 is provided with a generally centrally positioned sleeve 41 having a bushing 42 through which the fastening member 42*a* is threaded into engagement with the frame 28*a* to secure the VHF dial carriage 40 in the tuner for rotation about an axis generally perpendicular to the tuning axis and the plane of the UHF dial. The bracket 26*a* which supports the light 26 is also held by the threaded member 42*a*. A clear plastic cylindrical rim 43 is secured to the opaque carriage 40 and an indicia bearing strip 43*a* is held to the interior of the clear plastic rim and may be viewed through the opening 30 in the frame and opening 16 in the front of the television cabinet. A knob 44 having a mating inner periphery 44*a* is frictionally secured to the semi-flat end portion 36*a*, so that turning of the knob 44 selectively tunes the receiver for VHF tuning as well as directly mechanically turning the VHF dial to present to view the number of the VHF channel being tuned.

Further included in means 34 and telescoped over the VHF shaft is the multiple tuning shaft 46 which, through suitable clutch and indexing means in the receiving part of the tuner which form no part of this invention, may accomplish UHF coarse tuning and UHF and VHF fine tuning. The multi-tuning shaft 46 is provided with a semi-flattened end portion 46*a* for receiving the multi-tuning knob 48 and securing the same relative to the shaft through the aid of a spring clip 49 which is inserted between the hub 48*a* of the multi-tuning knob and a semi-flattened end portion of the multi-tuning shaft. Part of the clutch mechanism for multiple tuning is shown generally at 50. Since there is no direct connection between the UHF dial and the multi-tuning shaft, turning of the knob 48 to turn the multi-tuning shaft, will not of necessity cause movement of the UHF dial.

A UHF indicator shaft 52 is associated with the clutch means 50 and keyed to the interior of the hub portion 22*a* of the UHF dial so that when UHF tuning is being accomplished through the clutch mechanism, this will cause rotation of the UHF dial to present this tuning information to view.

The indicia bearing strip 43*a* of the VHF dial has a generally opaque face 56 with translucent indicia 58 thereabout. These indicia are preferably indexed in the 13 channel numbers of the VHF band as well as being provided with a UHF designation. When the VHF tuner is positioned for UHF tuning, the UHF indicia will appear to the eye of the viewer through the opening 16 in the cabinet. The opaque carriage is further provided with an opening 60 therein which is in alignment with the UHF indicia so that when the UHF indicia is positioned for viewing through the opening 16, the light transmitting opening in the VHF frame will be in alignment with the front of the cabinet or the openings 32 in the frame and 18 in the cabinet. Thus the light from the bulb 26 will not only illuminate the indicia UHF on the VHF tuning dial, but will also be transmitted to the UHF dial.

The UHF dial has a substantially disc-like, opaque surface 64 with light transmitting or translucent numbers 66. The light which shines through the opening 60 in the VHF frame when the VHF tuner is positioned for UHF tuning will illuminate the numbers on the UHF dial and present the same to view through the appropriate openings in the frame and cabinet of the receiver. In any of the other positions of the VHF dial, the light is blocked from illumination of the UHF dial to show only the VHF numbers.

Figure 9:
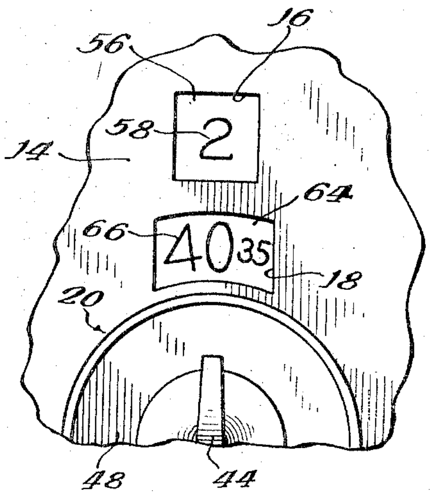
FIGURE 9 is a fragmentary enlarged view of a portion of the front of the television receiver of FIGURE 1 with the tuner structure positioned for VHF reception as shown in FIGURES 2 and 3.

FIGURES 2, 3 and 9 illustrate the tuner structure positioned for VHF reception. In the section view FIGURE 2, as well as the top view FIGURE 3, it can be clearly seen that the opening 60 is radially misaligned with respect to the light bulb 26 so that the illumination from the bulb is prevented from shining through the UHF dial 22. In FIGURE 9, the translucent VHF indicia 58 on the opaque face 56 of the indicia bearing strip is presented to view through the cabinet opening 16. The translucent UHF indicia 66 are also presented to view through opening 18, but because the source of illumination is masked from the UHF dial, the translucent indicia thereon are not illuminated.

Figure 7:
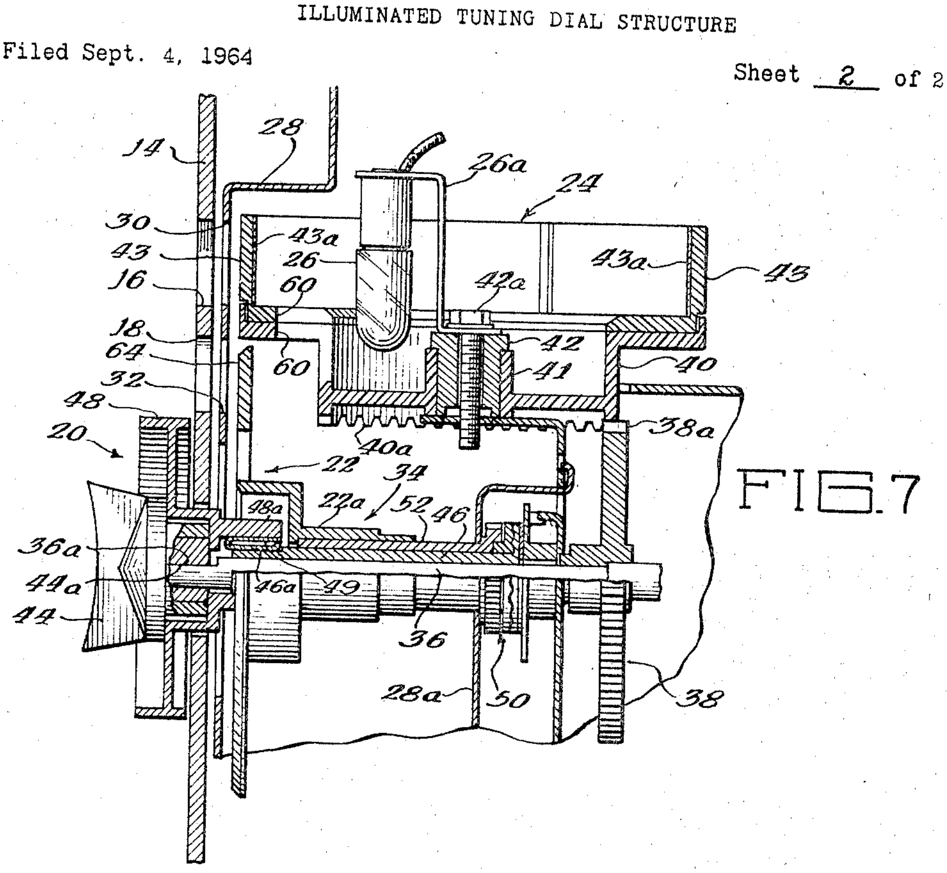
FIGURE 7 is a fragmentary enlarged view similar to FIGURE 2, but showing the tuner positioned for UHF reception.
Figure 8:
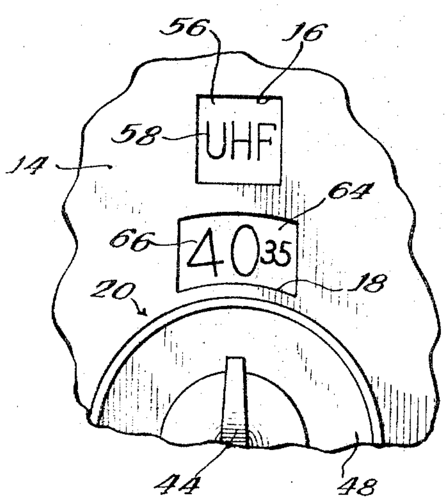
FIGURE 8 is a fragmentary front elevational view of the television set shown in FIGURE 1 with the tuner positioned for UHF reception as shown in FIGURES 4 and 7.

FIGURES 4, 7 and 8 illustrate the tuning apparatus positioned for UHF tuning. With reference to FIGURES 4 and 7, it can clearly be seen that the opening 60 is in radial alignment with the light bulb so that the illumination from the bulb may shine through the translucent indicia on the UHF dial. When so positioned for UHF tuning, the indicia UHF on the VHF dial is presented to view through opening 16. The indicia on the UHF dial are also illuminated so that the viewer is aware that he is tuned to the UHF frequency and can easily read the UHF dial channel to determine which is being tuned.

The tuning dial structure of this invention provides a means for associating the tuning indicating dials of a multiple frequency receiver wherein all tuning is accomplished about a single axis. The indicating dials are so arranged that, with but a single source of illumination, translucent indicia appearing on dials positioned in offset planes are coordinated with the tuning function of the receiver so that the viewer may readily determine which mode of reception the receiver is operating in and which frequency is being received within that mode.

We claim:

1. For use in a wave signal receiver having a plurality of drive shafts for connection with tuning units for changing the frequency and mode of frequency received by the wave signal receiver responsive to movement of the drive shafts, tuner indicator means, comprising: a source of illumination; a first dial driven by one of said shafts and having translucent frequency tuning indicia thereon; a second dial driven by the other of said shafts and being positioned adjacent said first dial, said second dial having mode and frequency tuning indicia thereon; said second dial being movable relative to said source of illumination responsive to movement of the other of said shafts to selectively move said mode and frequency tuning indicia into and out of a viewable position; and means connected to said second dial for masking the source of illumination from the first dial when the frequency tuning indicia of the second dial is in a viewable position and for illuminating the tuning indicia on said first dial when the mode tuning indicia of the second dial is in a viewable position.

2. The tuner indicator means of claim 1 wherein the second dial frequency indicia refers to VHF frequency and the second dial mode tuning indicia symbolizes UHF mode.

3. The tuner indicator means of claim 2 wherein the means for masking the source of illumination includes an interruption in the second dial, said interruption being related to the mode tuning indicia so as to be between the source of illumination and the first dial indicia when the mode tuning indicia is in a position of illumination wth respect to the source of illumination.

4. For use in a wave signal receiver having UHF and VHF tuning units, a drive shaft associated with each of the units for changing the frequency and mode of frequency received by the wave signal receiver responsive to turning of the drive shaft tuner indicator means, comprising: a first disc-like dial driven by one of the tuning shafts, said dial having translucent tuning frequency indicia thereon; a second cylindrical dial mounted for rotation about an axis generally transverse to the axis of the first dial and being driven by the other of the shafts, said second dial having translucent mode and frequency tuning indicia thereon; a source of illumination for said dials; and means connected to the second of said dials for masking the source of illumination from the first dial when the frequency tuning indicia of the second dial is in a position of illumination with respect to the source of illumination and for illuminating the tuning indicia on the first dial when the mode tuning indicia of the second dial is in a position of illumination with respect to the source of illumination.

5. The tuner indicator means of claim 4 wherein the source of illumination is positioned generally interiorly of the second cylindrical dial.

6. The tuner indicator means of claim 4 wherein the first dial has indicia thereon representing UHF frequency being tuned and wherein the second dial has indicia thereon representing the VHF frequency being tuned as well as indicia for designating that the UHF frequency mode is operative.

7. The tuner indicator of claim 5 wherein said means for masking the source of illumination includes a surface interruption in the second dial positioned relative to said mode tuning indicia so as to be between the first dial and the source of illumination when the mode tuning indicia is in a position of illumination with respect to the source of illumination.

References Cited

UNITED STATES PATENTS

| | | | |
|---|---|---|---|
| 2,738,758 | 3/1956 | Cutler et al. | 116—124.4 |
| 2,772,351 | 11/1956 | Machlin | 250—20 |
| 2,942,108 | 6/1960 | Goldstein et al. | 250—40 |
| 2,968,959 | 1/1961 | Emery | 74—10.27 |
| 3,018,326 | 1/1962 | Petrick et al. | 74—10.1 |
| 3,177,432 | 4/1965 | Kelly | 325—457 |
| 3,179,003 | 4/1965 | Tompson | 116—124.4 |
| 3,179,907 | 4/1965 | Brand et al. | 116—124 |

LOUIS J. CAPOZI, *Primary Examiner.*

U.S. Cl. X.R.

325—464; 74—10.45